United States Patent [19]

Maeguchi

[11] 4,395,726
[45] Jul. 26, 1983

[54] SEMICONDUCTOR DEVICE OF SILICON ON SAPPHIRE STRUCTURE HAVING FETS WITH DIFFERENT THICKNESS POLYCRYSTALLINE SILICON FILMS

[75] Inventor: Kenji Maeguchi, Yokohama, Japan

[73] Assignee: Tokyo Shibaura Denki Kabushiki Kaisha, Kawasaki, Japan

[21] Appl. No.: 134,678

[22] Filed: Mar. 27, 1980

[30] Foreign Application Priority Data

Mar. 30, 1979 [JP] Japan .................................. 54-36968

[51] Int. Cl.³ ...................... H01L 27/02; H01L 29/78
[52] U.S. Cl. ...................................... 357/41; 357/23; 357/42
[58] Field of Search ..................... 357/42, 41, 23 TF

[56] References Cited

U.S. PATENT DOCUMENTS 3,745,072 7/1973 Scott .................................... 357/42
4,097,314 6/1978 Schlesier et al. ..................... 357/42

OTHER PUBLICATIONS

Hsu, "Electron Mobility in SOS Films", IEEE Trans. Electron Devices, vol. ED-25 (8/78) pp. 913-916.

Primary Examiner—Gene M. Munson
Attorney, Agent, or Firm—Finnegan, Henderson, Farabow, Garrett and Dunner

[57] ABSTRACT

A semiconductor device has a plurality of field effect transistors on an insulating substrate. A semiconductor film constituting at least one of the plurality of field effect transistors is thinner than a semiconductor film of the other field effect transistor or transistors.

2 Claims, 18 Drawing Figures

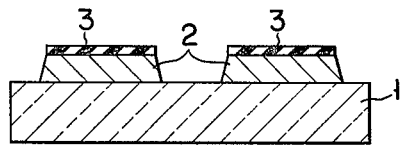
FIG. 1A
FIG. 1B 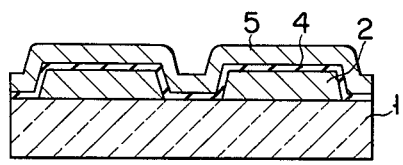 FIG. 1B' 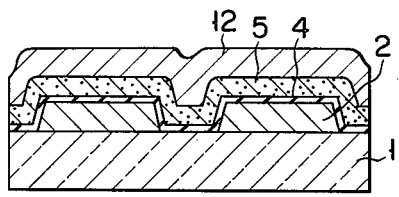
FIG. 1C 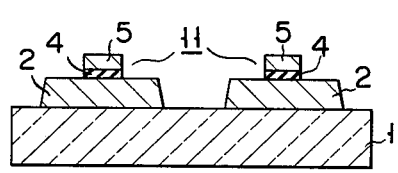 FIG. 1C' 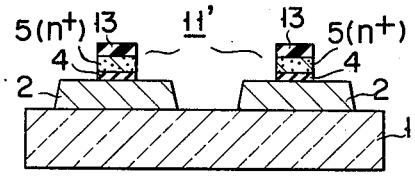

SEMICONDUCTOR DEVICE OF SILICON ON SAPPHIRE STRUCTURE HAVING FETS WITH DIFFERENT THICKNESS POLYCRYSTALLINE SILICON FILMS

BACKGROUND OF THE INVENTION

This invention relates to a semiconductor device in which a plurality of field effect transistors (FET's) such as complementary metal oxide semiconductor (CMOS) transistors are formed on an insulating substrate.

As a semiconductor device of this type, a semiconductor device of an SOS (silicon on sapphire) structure is known in which a CMOS transistor having a gate formed of a polycrystalline silicon (poly-Si) is formed on a sapphire substrate.

The manufacture of a conventional semiconductor device of an SOS structure will be explained by referring to FIG. 1.

An SOS wafer is prepared in which a silicon film 2 is epitaxially grown in thickness of 0.8 μm on a (1102) sapphire substrate. Usually, an SOS wafer not doped with any impurity has a P-type silicon film of a higher resistance (a specific resistance of above 100 Ω·cm). Silicon film 2 of the SOS wafer is selectively removed by a normal photoengraving process (PEP) to provide islands (FIG. 1(a)). After formation of these islands, a CVD (Chemical Vapor Deposition)·SiO₂ film 3 which is used as a mask during a selective etching is removed and a gate oxide film 4 and a poly-Si 5 constituting a gate electrode are sequentially grown on the resultant structure (FIG. 1(b)). A gate region 11 is selectively formed by a PEP technique (FIG. 1(c)). A PSG (phosphosilicate glass) film 6 is deposited on the whole surface of the resultant structure and selectively removed to leave a region below which an n-channel transistor is formed. The wafer is heat-treated at a high temperature in a diffusion furnace maintained in a boron (B) atmosphere. By so doing, phosphorus is diffused below the PSG film 6 to provide an n+ region 7 and boron is diffused in the PSG layer-free area to provide a p+ region 8 (FIG. 1(d)). Then, a CVD·SiO₂ film 9 is deposited on the surface of the resultant structure and selectively apertured to provide an electrode takeout opening. Then, aluminium 10 is evaporated on the resultant structure and an electrode connection is subjected to a patterning process to provide a C-MOS comprising a p-channel MOS and an n-channel MOS (FIG. 1(e)).

In order to attain a higher integration density of elements, a poly-Si constituting a gate electrode is processed to obtain a single electroconductivity type in the CMOS semiconductor device. In the above-mentioned manufacturing process, however, a poly-Si gate of an n+ electroconductivity type and poly-Si gate of a p+ electroconductivity type co-exist and a metal, such as aluminium, has to be deposited in a connected area between the n+ and p+ electroconductive poly-Si gates, preventing a higher integration density.

The manufacturing process of a CMOS having transistors of a single electroconductivity type is as follows:

After completion of the above-mentioned step (FIG. 1(b)) a PSG film 12 is deposited on the surface of the resultant structure and phosphorus is diffused at a high temperature into a poly-Si film (FIG. 1(b')). Then, after a PSG film 12 is removed, a CVD·SiO₂ film 13 is deposited and a gate region 11' having an n-type poly-Si film 5 is formed by PEP (FIG. 1(c')). The subsequent steps are the same as those of the abovementioned process. A CVD·SiO₂ film 13 on the poly-Si film prevents the intrusion of the other impurities in the subsequent steps.

The threshold voltage ($V_T$) of a CMOS transistor (hereinafter referred to as a CMOS/SOS) formed in the p-type silicon film on the sapphire substrate is expressed by the following equations.

Since the gate voltage of the n-channel transistor when an inversion layer is formed below the gate becomes a threshold voltage ($V_{Tn}$), when the width of a maximum depletion layer, xdmax, is smaller than the thickness ($t_{film}$) of the silicon film, that is, when $$\left[\frac{2\epsilon_{Si}(2\phi_t)}{qN_A}\right]^{\frac{1}{2}} < t_{film}, \quad V_{Tn} = \phi_{MS} - \frac{Q_{SS}}{C_{OX}} + 2\phi_t + \frac{Q_B}{C_{OX}} \quad (1)$$

where $$Q_B = [2N_A q \epsilon_{Si}(2\phi_t)]^{\frac{1}{2}} \quad (2)$$

when $$\left[\frac{2\epsilon_{Si}(2\phi_t)}{gN_A}\right]^{\frac{1}{2}} \geq t_{film} \quad (3)$$

$$V_{Tn} = \phi_{MS} - \frac{Q_{SS}}{C_{OX}} + 2\phi_t + \frac{qN_A t_{film}}{C_{OX}}$$

Since the p-channel transistor acts as a deep depletion type transistor the gate voltage when a depletion layer below a gate reaches the sapphire substrate becomes a threshold voltage ($V_{Tp}$) i.e.

$$V_{Tp} = \phi_{MS} - \frac{Q_{SS}}{C_{OX}} + \frac{qN_A t_{film}}{C_{OX}} + \frac{qN_A t_{film}^2}{2\epsilon_{Si}} \quad (4)$$

where $\phi_{MS}$: a work function between a metal and a semiconductor $Q_{SS}$: an amount of positive charges in the gate oxide film $C_{OX}$: a gate capacity $N_A$: an acceptor concentration in the silicon film $\epsilon_{Si}$: a dielectric constant of silicon $\phi_t$: a Fermi potential where an Si gate CMOS/SOS comprising n- and p-channel transistors having gates of an n+ type electroconductivity type is manufactured on the SOS wafer not doped with any impurity, the threshold voltages $V_{Tn} = +0.1(V)$ $V_{Tp} = -1.2(V)$ are obtained. In a large scale integrated circuit etc. the threshold voltages $V_{Tn} = +0.6 \sim 0.8(V)$ and $V_{Tp} = -0.6 \sim 0.8(V)$ are often required. The above-mentioned threshold voltage $V_T$ has to be obtained by some other method (for example, a method for injecting an ion into a channel below the gate). As seen from Equations (1) to (4) the threshold voltage $V_{Tp}$ of the p-channel transistor can be made lower by making the acceptor concentration in the silicon film higher and the threshold voltage $V_{Tn}$ of the n-channel transistor can be also made higher by making the acceptor concentration in the silicon film higher. FIG. 2 shows a gate voltage ($V_g$) vs. drain ($I_D$) characteristic. Since, however, the p-channel transistor acts as a deep depletion type transistor a drain leak current ($I_{DD}$) is increased by increasing the concentration of the acceptor in the silicon film. An increase in the drain leak current $I_{DD}$ disadvantageously increases a dissipation power at the stand-by time. The increase in the drain leak current may be controlled by making the silicon film thinner without appreciably increasing the acceptor concentration in the silicon film.

In FIG. 2 the solid lines $A_n$, $A_p$ substantially show the gate voltage ($V_g$)-drain current ($I_D$) characteristic of n- and p-channel transistors of a CMOS construction whose silicon film is not doped with any impurity, and the dotted lines $B_n$, $B_p$ show the variation of the characteristic of the n- and p-channel transistors when the acceptor concentration $N_A$ in the silicon film is increased (the n-channel transistor is further shifted toward a deeper $V_{th}$ and the p-channel transistor is further shifted toward a shallower $V_{th}$) and the variation of the characteristic ($B_{p'}$) of the p-channel transistor when the silicon film is made thinner.

SUMMARY OF THE INVENTION

One object of this invention is to provide a semiconductor device having a higher integration density.

Another object of this invention is to provide a CMOS field effect transistor of an SOS structure capable of controlling a lower threshold voltage without increasing a leakage current between the drain and the source.

Another object of this invention is to provide an E/D inverter of an SOS structure lesser in a power dissipation.

In one aspect of this invention there is provided a semiconductor device in which a plurality of field effect transistors are formed on an insulating substrate and a semiconductor film constituting at least one of the plurality of field effect transistors is thinner than a semiconductor film of the other transistor or transistors.

In another aspect of this invention there is provided a semiconductor device comprising an insulating substrate, an insulated gate field effect transistor formed on the insulating substrate and having a first conductivity type channel, and an insulated gate field effect transistor formed on the insulating substrate and having a second conductivity type channel, in which a semiconductor film constituting the transistor having the first conductivity type channel is thinner than a semiconductor film constituting the transistor of the second conductivity type channel.

Preferably, the gates of the above-mentioned two insulated gate field effect transistors have the same conductivity type.

DETAILED DESCRIPTION OF THE PREFERRED EMBODIMENT

Figure 1D:
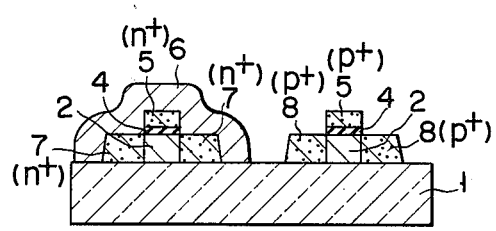
FIGS. 1(a), (b), (b'), (c), (c'), (d) and (e) are cross-sectional views showing the steps of a process for manufacturing a conventional semiconductor device.
Figure 1E:
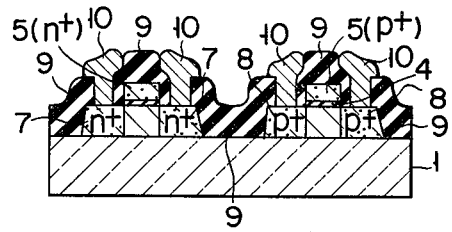
Figure 2:
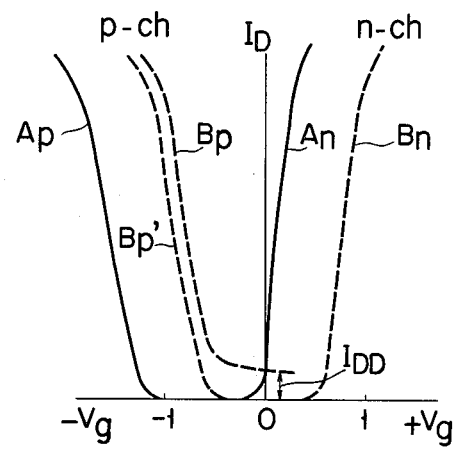
FIG. 2 is a curve showing a relation of a gate voltage to a drain current.
Figure 3A:
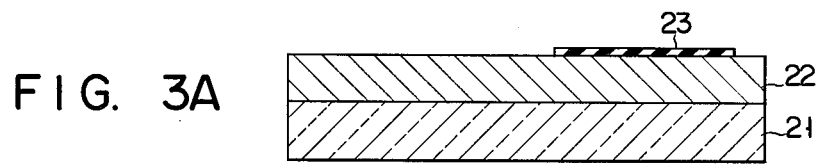
FIGS. 3(a) to (h) are cross-sectional views showing the steps of a process for manufacturing a semiconductor device according to one embodiment of this invention.
Figure 3B:
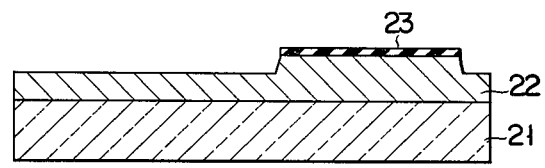
Figure 3C:
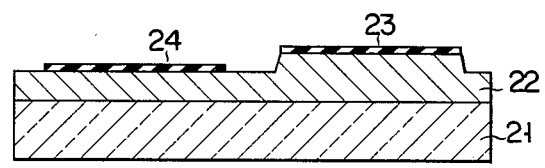
Figure 3D:
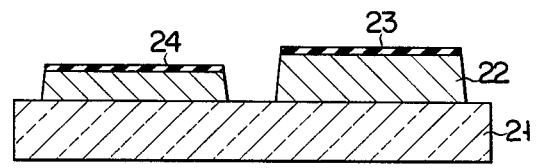
Figure 3E:
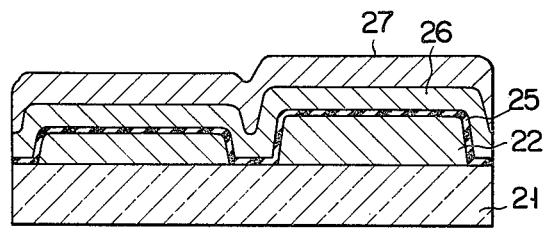
Figure 3F:
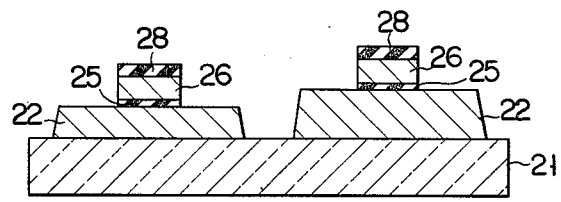
Figure 3G:
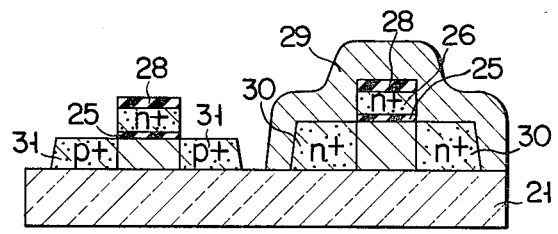
Figure 3H:
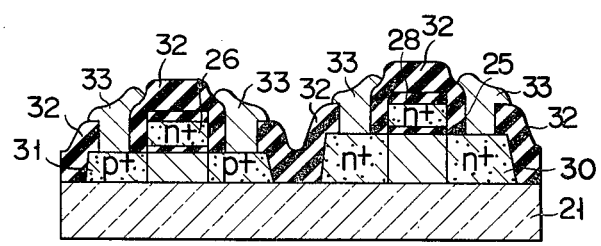

A semiconductor device according to one embodiment of this invention will be explained below by reference to FIGS. 3(a) to (h).

A 0.8 μm-thick, p-type (100) single crystal silicon film 22 having a specific resistance of above 100 Ω·cm formed on a (1102) sapphire substrate 21 is prepared. Boron is ion-implanted into the silicon film to the extent of about $5 \times 10^{11}/cm^2$. A CVD·SiO$_2$ film 23 is deposited on the silicon film 22. The CVD·SiO$_2$ film 23 is selectively etched away by a normal PEP technique, except for an area constituting an n-channel transistor, to expose an exposed silicon film (FIG. 3(a)). The exposed silicon film is etched about 0.3μ using a KOH+isopropyl alcoholic solution (FIG. 3(b)). A CVD·SiO$_2$ film 24 is 0.1μ deposited on the resultant structure and selectively etched, as in the case of the process (3a), except for an area constituting a p-channel transistor (FIG. 3(c)), to expose the silicon film. With the remaining CVD·SiO$_2$ films (23), (24) as a mask the silicon film is completely etched down to the surface of the sapphire substrate to cause a separation to be effected between elements (FIG. 3(d)). As a result, two kinds of silicon islands of different silicon film thicknesses are formed on the sapphire substrate 21. After completion of the process (d) a gate oxide film 25 is grown in thickness of 800 A at 1,000° C. under the atmosphere of a dry O$_2$, and a poly-Si (26) is 0.4μ deposited on the surface of the resultant structure. A PSG film 27 is 0.3μ deposited on the poly-Si (26)—FIG. 3(e). In this state, heat processing is effected for 20 minutes at 1,000° C., causing phosphorus to be diffused in poly-Si to permit a resistance to be reduced. With the PSG film removed, a CVD·SiO$_2$ film 28 is 0.1μ deposited on the surface of the poly-Si 26. A gate region is formed using the PEP technique (FIG. 3(f)). Then, a PSG film 29 is 0.3μ deposited on the resultant structure. With the PSG film left to cover a thicker silicon film area, the other PSG film is etched away (FIG. 3(g)). In this state, the wafer is introduced into a diffusion furnace having a boron atmosphere and a heat treatment is effected for 20 minutes at 1,000° C. As a result, phosphorus (p) is diffused into the PSG layer to provide an n+ region 30 and boron is diffused into the exposed silicon area to provide a p+ region 31. After the PSG film is removed, a CVD·SiO$_2$ film 32 is 0.8μ deposited and a contact opening is formed to take out a corresponding electrode. After aluminium 33 is deposited, it is selectively etched to complete the formation of an electrical connection (FIG. 3(h)). In this way, p- and n-channel FET's are formed having a gate whose electroconductivity is of an n-type. The gates of the p- and n-channel transistors are commonly connected and the drains of the p- and n-channel transistors are commonly connected.

The threshold voltage of a CMOS/SOS transistors so manufactured is +0.6 V for an n-channel transistor and −0.8 V for a p-channel transistor. If the threshold voltage of the n-channel transistor has to be made at a level of +0.8 V, it is only necessary that boron be ion-implanted into a channel below the gate to the extent of about $2 \times 10^{11}/cm^2$. The CMOS/SOS transistor has as good a characteristic (such as the effective mobility, drain leak current) as that of a transistor formed in the conventional process, to the exclusion of the threshold voltage.

As in the above-mentioned embodiment, various advantages can be obtained by making the silicon film of the p-channel transistor thinner than that of the n-channel transistor.

First, a lower threshold voltage (below −1.0 V) can be controlled without increasing a leak current between the source and the drain. This is very advantageous, because the margin of a design is made wider for an LSI element. Secondly, with a shorter channel length a drop in the threshold voltage can be made smaller by making the silicon film thinner. Since the volume of a semiconductor film below the gate is smaller, there is a lesser influence from the extension of a depletion layer from the drain. Such a smaller short channel effect provides advantages to the microminiaturization of elements. Thirdly, a smaller-stepped area is formed with respect to the sapphire surface on the silicon island by making the silicon film thinner. As a result, no breakage of an electrical connection occurs at the stepped area.

Fourthly, in the conventional manufacturing step n- and p-channel transistors are formed using one sheet of mask and, for this reason, the distance between both the elements is restricted by a PEP technique such as a mask aligner. According to this invention, on the other hand, n- and p-channel transistors are separately formed and the distance between both the elements is restricted only by the aligning accuracy of the mask aligner, thereby permitting the distance to be decreased to a greater extent. This is very advantageous to a high integration density.

The same advantages can be obtained by making the silicon film of the n-channel transistor thinner than that of the p-channel transistor. Advantageous results can be obtained in particular in the case of an n-channel transistor which constitutes together with a p-channel transistor a CMOS/SOS, the n- and p-channel transistors having poly-Si gates of p+ type electroconductivity types. In this case, it is because a deep depletion type operation mode can often be adopted in the n-channel transistor.

Figure 4:
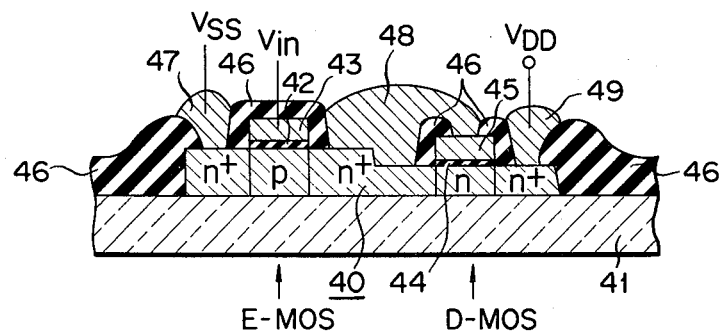
FIG. 4 is a cross-sectional view showing a semiconductor device according to another embodiment of this invention.

FIG. 4 is a cross-sectional view showing an E/D inverter of an SOS structure according to another embodiment of this invention. In FIG. 4, 41 shows a (1102) sapphire substrate. A thick and a thin silicon film 40 both made of a (100) silicon single crystal are continuously formed on the substrate 41. As indicated by arrows in FIG. 4 the thick silicon film constitutes an enhancement type MOS transistor (E-MOS) and the thin silicon film constitutes a depletion type MOS transistor (D-MOS). 42 shows an $SiO_2$ film formed on the channel of E-MOS. A poly-Si gate 43 is formed on the $SiO_2$ film 42. 44 shows an $SiO_2$ film formed on the channel of a D-MOS. A poly-Si gate 45 is formed on the $SiO_2$ film 44. 46 shows a field oxide film; 47, a source electrode of the E-MOS; 48, an electrode by which the drain of the E-MOS is connected to the gate of the D-MOS, and 49, the drain electrode of the D-MOS.

Figure 5:
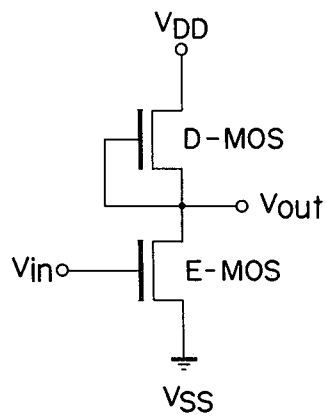
FIG. 5 shows a circuit diagram of the FIG. 4 embodiment.

FIG. 5 shows a circuit of an E/D inverter of FIG. 4. According to this embodiment the control of the channel current for the D-MOS can be done by making the silicon films of the D-MOS thinner than the other silicon film, as shown in FIG. 4. As a result, the manufacturing method becomes simpler and free, and a power dissipation can be reduced.

This invention can be applied to not only an air-isolation type semiconductor device as in the abovementioned two embodiments, but also a semiconductor structure in which insulation is effect by a selective oxide method i.e. by embedding insulating material, such as $SiO_2$, between FET's on the insulating substrate. This invention can also be applied to an FET in which a gate electrode is constituted of a Schottky barrier.

What is claimed is:

1. A semiconductor device including an insulating substrate, a first silicon film on said substrate to form a depletion mode field effect transistor on said substrate, said first silicon film comprising a source, drain and channel of one conductivity type, a second silicon film on said substrate to form an enhancement mode field effect transistor formed on said substrate, said second silicon film comprising a source and drain of said one conductivity type and a channel of opposite conductivity type, with the source of said depletion mode transistor formed integral with the drain of said enhancement mode transistor, and with the thickness of said first silicon film which constitutes said depletion mode transistor being thinner than said second silicon film which constitutes said enhancement mode transistor.

2. A semiconductor device of claim 1 wherein the drain of said enhancement mode transistor is connected to the gate of said depletion mode transistor to form an E/D inverter.

* * * * *